US009382624B2

(12) United States Patent
Nakagawa et al.

(10) Patent No.: US 9,382,624 B2
(45) Date of Patent: Jul. 5, 2016

(54) FILM FORMATION METHOD USING OSCILLATORS FOR MEASUREMENT AND CALIBRATION DURING CALIBRATION STEP PERFORMED DURING FILM FORMATION

(71) Applicant: CANON KABUSHIKI KAISHA, Tokyo (JP)

(72) Inventors: Yoshiyuki Nakagawa, Chiba (JP); Shingo Nakano, Chiba (JP); Naoto Fukuda, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/635,558

(22) Filed: Mar. 2, 2015

(65) Prior Publication Data

US 2015/0176129 A1 Jun. 25, 2015

Related U.S. Application Data

(62) Division of application No. 13/281,036, filed on Oct. 25, 2011, now abandoned.

(30) Foreign Application Priority Data

Nov. 4, 2010 (JP) ................................. 2010-247816
Sep. 28, 2011 (JP) ................................. 2011-211799

(51) Int. Cl.
*C23C 14/24* (2006.01)
*C23C 16/52* (2006.01)
(Continued)

(52) U.S. Cl.
CPC ................ *C23C 16/52* (2013.01); *C23C 14/24* (2013.01); *C23C 14/546* (2013.01); *C23C 16/46* (2013.01)

(58) Field of Classification Search
CPC .............................. C23C 14/24; C23C 14/243
See application file for complete search history.

(56) References Cited

U.S. PATENT DOCUMENTS 3,946,257 A 3/1976 Kawamura
4,207,836 A * 6/1980 Nonaka ................... G05D 5/03
118/664

(Continued)

FOREIGN PATENT DOCUMENTS

CN 1386892 A 12/2002
JP 57-106808 * 7/1982

(Continued)

OTHER PUBLICATIONS

Krakow, W., et al., "The Growth of Crystalline Vapor Deposited Carbon-60 Thin Films". Appl, Phys. A 56, 185-192 (1993).*

(Continued)

*Primary Examiner* — Bret Chen
(74) *Attorney, Agent, or Firm* — Fitzpatrick, Cella, Harper & Scinto

(57) ABSTRACT

A film formation method controls with accuracy the thickness of a thin film formed on a film formation object. The film formation method includes a film formation step of heating a film formation source and forming a film on a film formation object while moving the film formation source and monitoring an amount of released vapors of the film forming material using a quartz oscillator for measurement, a control step of adjusting a heating temperature of the film formation source based on the monitored value of the quartz oscillator for measurement, and a calibration step of calibrating the monitored value of the quartz oscillator for measurement, using a quartz oscillator for calibration and the quartz oscillator for measurement. The calibration step is performed in a middle of the film formation step, after movement of the film formation source is started from a waiting position.

7 Claims, 5 Drawing Sheets

(51) Int. Cl.
*C23C 14/54* (2006.01)
*C23C 16/46* (2006.01)

(56) References Cited

U.S. PATENT DOCUMENTS

| | | | | |
|---|---|---|---|---|
| 4,959,999 | A * | 10/1990 | Tamura | G01L 21/22 73/755 |
| 5,331,845 | A | 7/1994 | Bals et al. | |
| 5,684,574 | A * | 11/1997 | Shiokawa | G01N 21/314 250/559.28 |
| 6,513,451 | B2 | 2/2003 | Van Slyke et al. | |
| 7,964,037 | B2 | 6/2011 | Fukuda et al. | |
| 2002/0189542 | A1 | 12/2002 | Van Slyke et al. | |
| 2004/0007183 | A1* | 1/2004 | Slyke | C23C 14/545 118/723 VE |
| 2004/0031442 | A1 | 2/2004 | Yamazaki et al. | |
| 2004/0123804 | A1 | 7/2004 | Yamazaki et al. | |
| 2004/0144321 | A1 | 7/2004 | Grace et al. | |
| 2005/0244570 | A1 | 11/2005 | Tanase et al. | |
| 2005/0252273 | A1* | 11/2005 | Imoto | G01N 1/24 73/23.2 |
| 2008/0241367 | A1* | 10/2008 | Petersen | G11B 5/8408 427/127 |
| 2009/0061079 | A1* | 3/2009 | Konishiike | C23C 14/562 427/78 |
| 2009/0269486 | A1* | 10/2009 | Yamazaki | C23C 14/042 427/66 |
| 2010/0007979 | A1* | 1/2010 | Tsukada | G01N 29/022 360/31 |
| 2011/0239941 | A1 | 10/2011 | Nakagawa et al. | |
| 2012/0114833 | A1 | 5/2012 | Nakagawa et al. | |
| 2012/0114838 | A1 | 5/2012 | Nakagawa et al. | |
| 2012/0114839 | A1 | 5/2012 | Fukuda et al. | |
| 2012/0114840 | A1 | 5/2012 | Fukuda et al. | |

FOREIGN PATENT DOCUMENTS

| | | | |
|---|---|---|---|
| JP | 63-219582 | * | 9/1988 |
| JP | 7-301591 | * | 11/1995 |
| JP | 2004-091919 | | 3/2004 |
| JP | 2006-206969 A | | 8/2006 |
| JP | 2008-122200 | | 5/2008 |
| JP | 2010-196082 | * | 9/2010 |
| JP | 2010-196082 A | | 9/2010 |

OTHER PUBLICATIONS

Krim, J., et al., "Quartz Monitors and Microbalances" from Handbook of Thin Film Process Technology, 1195 IOP Publishing Ltd. pp. 1-6.*
Ito, Takaya, "Kinetics study on initial growth stage in vapor deposition of organic thin film using quartz crystal microbalance". Japanese Journal of Applied Physics 50 (6), p. 060209, Jun. 6, 2006, 13 pages.*
Kaushik, D.K., et al., "Simple and inexpensive single-oscillation quartz crystal thin-film thickness monitor and growth-rate meter". J. Phys. E: Sci. Instrum. 20 (1987), pp. 254-256.*
Korean Office Action issued in counterpart application No. 10-2011-0110886 dated Apr. 28, 2014, along with its English-language translation—12 pages.
Taiwanese Office Action issued in application No. 100139151 dated Jan. 20, 2014, along with its English-language translation—8 pages.
Chinese Office Action issued in application No. 201110339499.5 dated Oct. 14, 2013, along with its English-language translation—17 pages.
Chinese Office Action issued in application No. 201110339521.6 dated Oct. 14, 2013, along with its English-language translation—14 pages.
Office Action in Chinese Patent Application No. 201110339500.4, issued Oct. 14, 2013, with English translation (13 pgs.).
Korean Office Action issued in corresponding 10-2011-0110886 dated Nov. 10, 2014—11 pages with translation of substantive rejection portion.

* cited by examiner

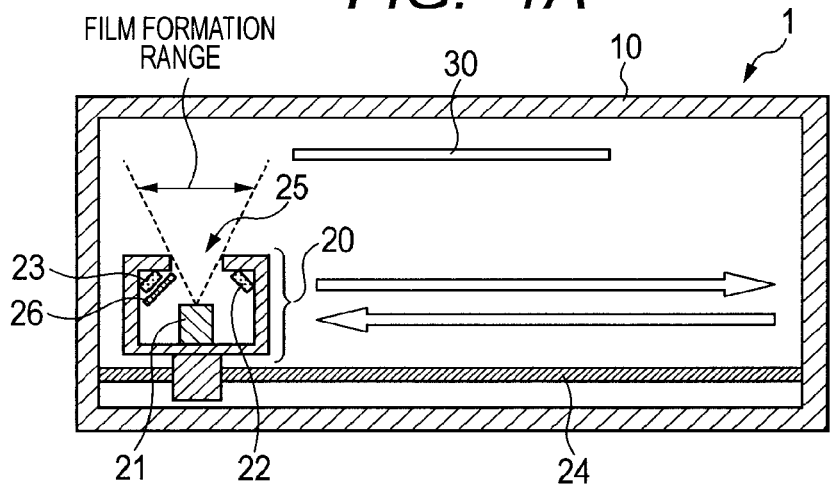
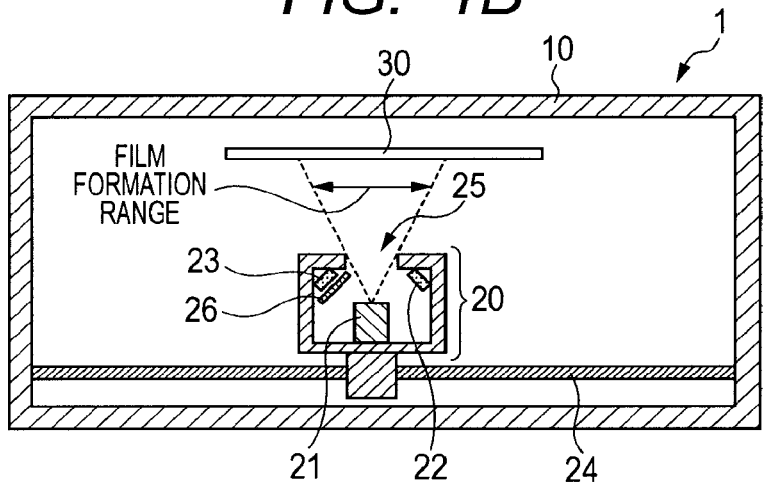
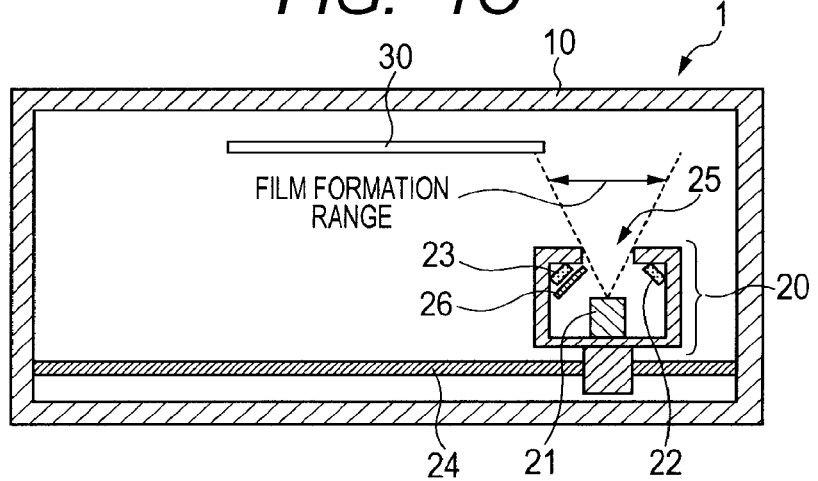

( ①: FILM THICKNESS VALUE DATA, ②: CALIBRATION DATA )

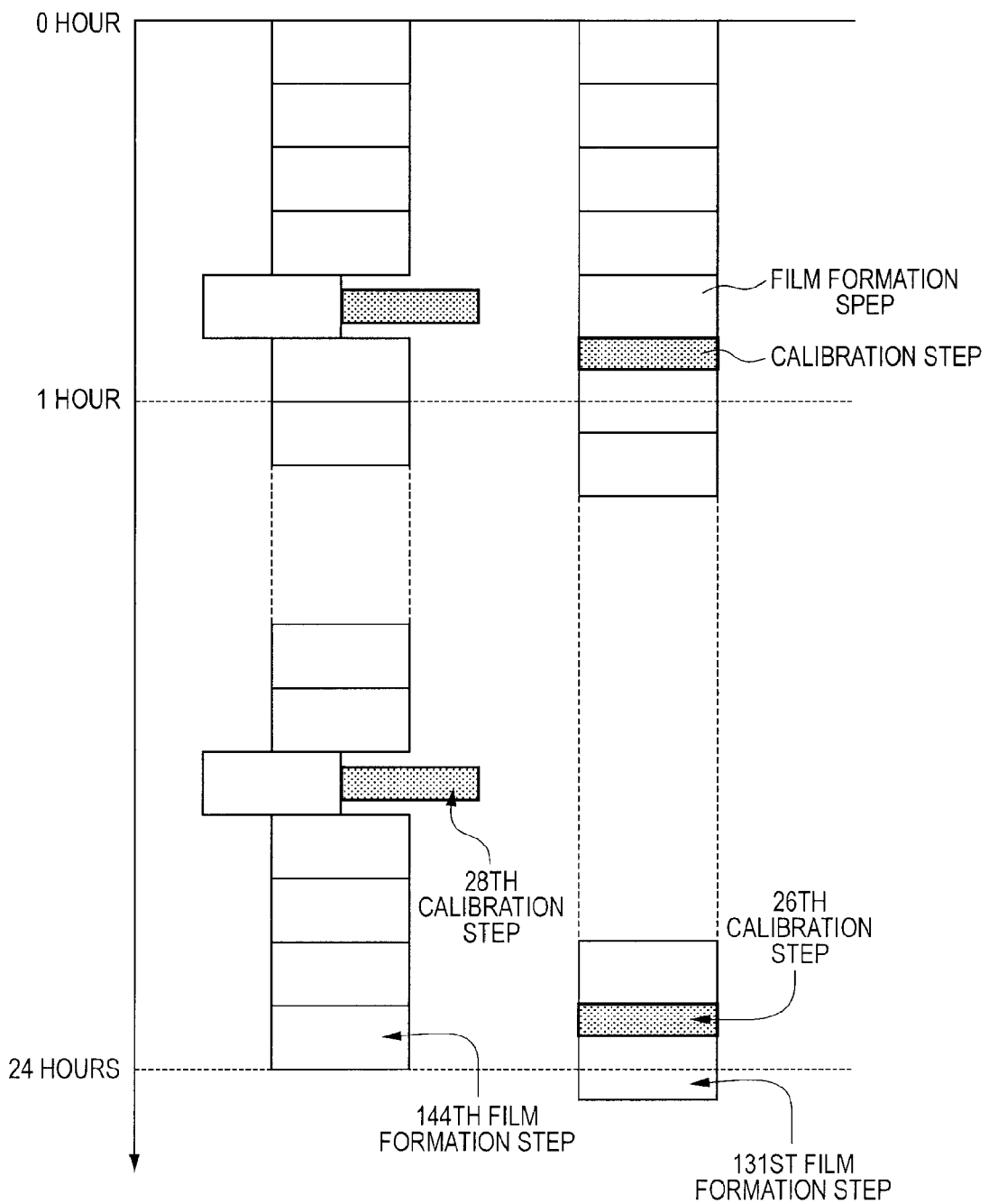

FILM FORMATION METHOD USING OSCILLATORS FOR MEASUREMENT AND CALIBRATION DURING CALIBRATION STEP PERFORMED DURING FILM FORMATION

The present application is a division of U.S. patent application Ser. No. 13/281,036 filed Oct. 25, 2011, now abandoned, the entire disclosure of which is incorporated by reference herein.

BACKGROUND OF THE INVENTION

1. Field of the Invention

The present invention relates to a film formation apparatus and a film formation method which uses the film formation apparatus.

2. Description of the Related Art

Conventionally, when a thin film is formed on a film formation object such as a substrate by evaporation, sputtering, or the like, in order to control the thickness of the thin film to be formed, a quartz oscillator is placed in a film formation chamber. When a quartz oscillator is placed in the film formation chamber, in forming the thin film, a film forming material forming the thin film is deposited both on the quartz oscillator and on the film formation object. Here, as the film forming material is deposited on the quartz oscillator, the resonance frequency of the quartz oscillator changes according to the amount of the film forming material deposited thereon. Using this phenomenon, the thickness of the film of the film forming material deposited on the film formation object may be known. Specifically, the thickness of the film deposited on the quartz oscillator is calculated from the amount of change in resonance frequency. With the film thickness ratio between the film deposited on the quartz oscillator and the film deposited on the film formation object which is determined in advance, the thickness of the film of the film forming material deposited on the film formation object may be known.

However, as the film forming material is deposited on the quartz oscillator, the relationship between the amount of change in resonance frequency and the thickness value of the film deposited on the film formation object is deviated from the calculated values. Therefore, it is difficult to control the thickness of the film on the film formation object with accuracy for a long period of time.

Japanese Patent Application Laid-Open No. 2008-122200 discloses a method of making smaller a film thickness value error which presents a problem in controlling the thickness of a film on a film formation object. More specifically, in Japanese Patent Application Laid-Open No. 2008-122200, a method is adopted in which, in addition to a conventional quartz oscillator for measurement, a quartz oscillator for calibration for calibrating the deviation of the film thickness value calculated from the amount of change in resonance frequency of the quartz oscillator for measurement is provided in the film formation chamber.

In an ordinary film formation step, first, the film formation object is brought into the film formation chamber, and a film is formed on the film formation object. Here, when the film is formed on the film formation object, the film forming material is deposited on the quartz oscillator for measurement to control the thickness of the film on the film formation object. After the film formation is completed, the film formation object is taken out of the film formation chamber, and the film formation step is completed. However, when the film formation step is repeated multiple times, the film forming material is deposited on the quartz oscillator for measurement each time the film formation step is performed, and thus, the accuracy of the film thickness control is lowered as the film formation step is repeated. Therefore, the quartz oscillator for calibration is used to carry out a calibration step for calibrating the film thickness calculated using the quartz oscillator for measurement.

In the film formation method disclosed in Japanese Patent Application Laid-Open No. 2008-122200, the calibration step is performed between film formation steps, that is, after a film formation step is completed and before the subsequent film formation step is started. In this calibration step, first, the film forming material is deposited both on the quartz oscillator for calibration and on the quartz oscillator for measurement. Then, the thickness of the thin film formed on the film formation object which is determined using the quartz oscillator for calibration (film thickness value $P_0$) and the thickness of the thin film formed on the film formation object which is determined using the quartz oscillator for measurement (film thickness value $M_0$) are measured, and a calibration coefficient $P_0/M_0$ is determined. Then, in the film formation step which is performed after the calibration step, by multiplying a film thickness value $M_1$ of the film formation object which is calculated using the quartz oscillator for measurement by the calibration coefficient $P_0/M_0$ which is determined in advance, the thickness of the film on the film formation object is controlled with accuracy.

On the other hand, Japanese Patent Application Laid-Open No. 2004-091919 discloses an apparatus and a method for forming a film having a uniform thickness on a surface of a film formation object. In the thin film formation apparatus disclosed in Japanese Patent Application Laid-Open No. 2004-091919, a movable film formation source moves with constant speed below a fixed film formation object. By forming a thin film using the thin film formation apparatus, a film having a uniform thickness may be formed on the film formation object even if the film formation object has a large area.

Further, in the thin film formation apparatus disclosed in Japanese Patent Application Laid-Open No. 2004-091919, in order to monitor the amount of the film forming material released from the film formation source, a film thickness sensor (corresponding to quartz oscillator for measurement) is provided which is fixed above a waiting position of the film formation source. The film thickness sensor may detect the film forming speed of the film forming material, and thus, at the time when the film forming speed reaches a desired level, the film formation source moves to a film forming position to form a film on the film formation object.

As described above, in Japanese Patent Application Laid-Open No. 2008-122200, the calibration step is performed between film formation steps. However, when the calibration step is performed between film formation steps, the film is not formed on the film formation object during that period, and thus, there is a problem that the productivity is lowered.

On the other hand, in Japanese Patent Application Laid-Open No. 2004-091919, the film thickness sensor is fixed at the waiting position of the film formation source (the position at which the film is not formed on the film formation object), and thus, the film thickness sensor cannot monitor the amount of the film forming material released from the film formation source during the film formation step. Therefore, even if the quartz oscillator for calibration disclosed in Japanese Patent Application Laid-Open No. 2008-122200 is provided in the thin film formation apparatus disclosed in Japanese Patent Application Laid-Open No. 2004-091919, it is impossible to carry out the calibration step during the film formation step.

SUMMARY OF THE INVENTION

The present invention has been made to solve the problems described above, and an object of the present invention is to provide a film formation apparatus and a film formation method which may control with accuracy the thickness of a thin film formed on a film formation object without lowering the productivity.

According to the present invention, it is possible to provide the film formation apparatus and the film formation method which may control with accuracy the thickness of the thin film formed on the film formation object without lowering the productivity.

Further features of the present invention will become apparent from the following description of exemplary embodiments with reference to the attached drawings.

BRIEF DESCRIPTION OF THE DRAWINGS

FIG. 1A is a schematic view illustrating a film formation apparatus according to an embodiment of the present invention, which is obtained when a film formation source is at a film formation waiting position, and FIGS. 1B and 1C are schematic views illustrating the film formation apparatus according to the embodiment of the present invention, which are obtained when the film formation source is at a film forming position.

FIGS. 5A and 5B are diagram which simulates film formation steps and the calibration steps in predetermined cycles with the passage of time, FIG. 5A is a diagram illustrating the passage of time when a calibration step is performed in the middle of a film formation step and FIG. 5B is a diagram illustrating the passage of time when a calibration step is performed between film formation steps.

DESCRIPTION OF THE EMBODIMENT

Figure 2:
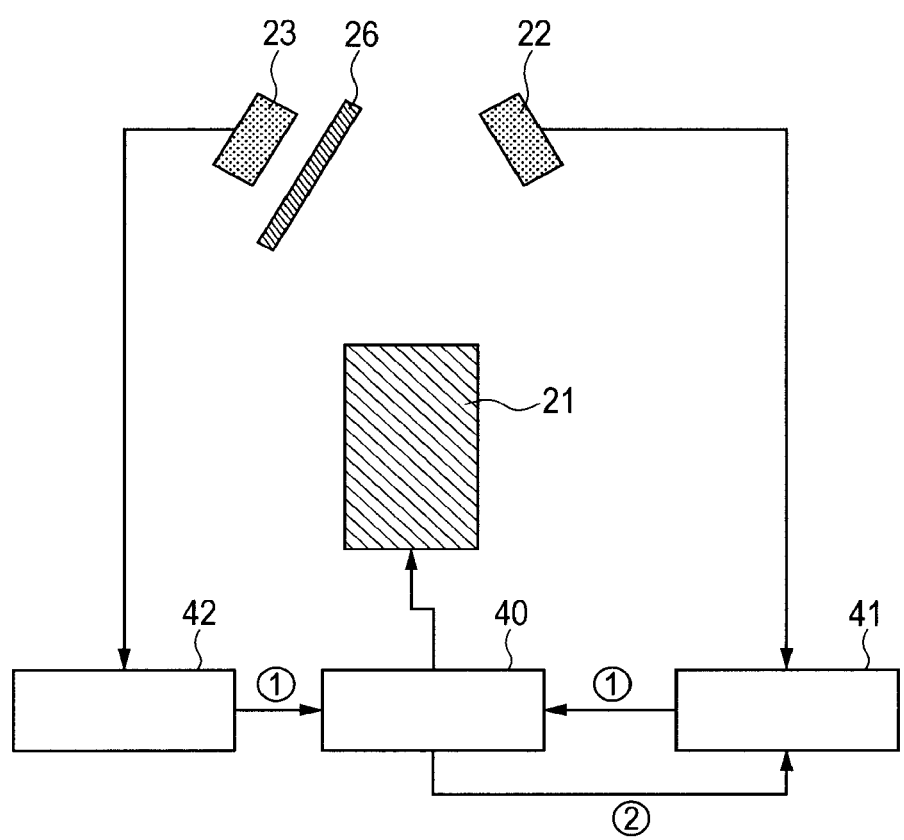
FIG. 2 is a circuit block diagram illustrating a control system of the film formation apparatus illustrated in FIGS. 1A, 1B and 1C.

A film formation apparatus according to the present invention includes a film formation source, a quartz oscillator for measurement, and a quartz oscillator for calibration.

In the film formation apparatus according to the present invention, when a thin film of a film forming material is formed on a film formation object, the film forming material is heated in the film formation source to release vapors of the film forming material.

In the film formation apparatus according to the present invention, the quartz oscillator for measurement is a quartz oscillator which measures the thickness of the thin film of the film forming material formed on the film formation object, while the quartz oscillator for calibration is a quartz oscillator which calibrates the quartz oscillator for measurement. Note that, in the present invention, the timing at which the quartz oscillator for calibration calibrates the quartz oscillator for measurement may be arbitrarily decided.

Further, in the film formation apparatus according to the present invention, there is provided a moving part for moving the film formation source between a predetermined film formation waiting position and a predetermined film forming position. The moving part holds the quartz oscillator for measurement and the quartz oscillator for calibration so that their relative positions with respect to the film formation source are maintained.

The film formation apparatus according to the present invention is described in the following with reference to the attached drawings, but the present invention is not limited thereto. Further, appropriate modifications can be made thereto without departing from the gist of the present invention.

FIG. 1A is a schematic view illustrating a film formation apparatus according to an embodiment of the present invention, which is obtained when the film formation source is at the film formation waiting position, and FIGS. 1B and 1C are schematic views illustrating the film formation apparatus according to the embodiment of the present invention, which are obtained when the film formation source is at the film forming position. Note that, FIGS. 1A to 1C are schematic sectional views of the film formation apparatus when viewed from the front.

In a film formation apparatus 1 illustrated in FIGS. 1A to 1C, a film formation source unit 20 as a moving part for moving a film formation source 21 is provided at a predetermined position in a film formation chamber 10. In this film formation source unit 20, two kinds of quartz oscillators, that is, a quartz oscillator 22 for measurement and a quartz oscillator 23 for calibration are provided.

In the following, members forming the film formation apparatus 1 illustrated in FIGS. 1A to 1C are described. Note that, the film formation apparatus 1 illustrated in FIGS. 1A to 1C is used in, for example, manufacturing an organic electroluminescent (EL) element.

In the film formation apparatus 1 illustrated in FIGS. 1A to 1C, the film formation chamber 10 is connected to a vacuum exhaust system (not shown). The vacuum exhaust system may exhaust the film formation chamber 10 so that the pressure therein is in a range of $1.0\times10^{-4}$ Pa to $1.0\times10^{-6}$ Pa.

In the film formation apparatus 1 illustrated in FIGS. 1A to 1C, the film formation source unit 20 may reciprocate along a rail 24 provided in the film formation chamber 10 in the direction of arrows illustrated in FIG. 1A, more specifically, between the film formation waiting position and the film forming position. Here, the film formation waiting position is a position of the film formation source unit 20 when a film of the film forming material is not formed on a film formation object 30. More specifically, the film formation waiting position is a position of the film formation source unit 20 when the film formation object 30 is outside a range in which the evaporation material may attach thereto as in FIG. 1A in which the film formation object 30 is not immediately above the film formation source unit 20. On the other hand, the film forming position is a position of the film formation source unit 20 when a film of the film forming material is formed on the film formation object 30. More specifically, the film forming position is a position of the film formation source unit 20 when the film formation object 30 is in the range in which the evaporation material may attach thereto (film formation range) as in FIGS. 1B and 1C.

Note that, in the present invention, the shape of the film formation source unit 20 is not specifically limited, but, from the viewpoint of selectively releasing vapors of the film forming material from a predetermined position, it is preferred that the film formation source unit 20 be a box having an opening 25 provided in an upper portion thereof for releasing vapors of the film forming material. By causing the film formation source unit 20 to be a box, the direction of travel and the distribution of vapors of the film forming material released from the film formation source unit 20 may be controlled by the shape of the opening 25. Further, in the present invention, the size of the film formation source unit 20 is not specifically limited. Note that, the size of the film formation source unit 20 is appropriately set taking into consideration the balance thereof with other members including the film formation chamber 10.

When the film formation source unit 20 reciprocates along the rail 24 between the film formation waiting position and the film forming position as illustrated in FIG. 1A, a movement control part (not shown) for controlling the moving speed may be provided in the film formation source unit 20. In particular, if the movement control part may move the film formation source unit 20 with constant speed, a film of the film forming material may be uniformly formed on the film formation object 30, which is preferred.

The shape of the film formation source 21 provided in the film formation source unit 20 may be appropriately set taking into consideration the size of the film formation object 30 and the distribution of vapors of the film forming material. Further, multiple film formation sources 21 may be provided in the film formation source unit 20. The film forming material (not shown) is housed in the film formation source 21 which is provided in the film formation source unit 20. By heating the film forming material with a heating part (not shown) provided in the film formation source 21, vapors of the film forming material may be released from the film formation source 21.

Further, in the film formation source unit 20, the two kinds of quartz oscillators, that is, the quartz oscillator 22 for measurement and the quartz oscillator 23 for calibration are provided. Here, the two kinds of quartz oscillators (quartz oscillator 22 for measurement and quartz oscillator 23 for calibration) are fixed at predetermined positions in the film formation source unit 20, more specifically, at positions at which the quartz oscillators do not block vapors of the film forming material moving toward the film formation object 30. The two kinds of quartz oscillators always move together with the film formation source 21, and thus, the relative positions of the two kinds of quartz oscillators (quartz oscillator 22 for measurement and quartz oscillator 23 for calibration) with respect to the film formation source 21 are always maintained at the predetermined positions. In other words, the relative position of the film formation source 21 and the quartz oscillator 22 for measurement and the relative position of the film formation source 21 and the quartz oscillator 23 for calibration are always fixed. To maintain the relative positions of the film formation source 21 and the quartz oscillators (quartz oscillator 22 for measurement and quartz oscillator 23 for calibration) in this way is important in monitoring the amount of vapors of the film forming material released from the film formation source 21.

Note that, a sensor shutter 26 may be provided in proximity to the two kinds of quartz oscillators (quartz oscillator 22 for measurement and quartz oscillator 23 for calibration). By providing the sensor shutter 26, the film forming material may be caused to attach to the respective quartz oscillators at a predetermined timing and vapors of the film forming material may be blocked at a predetermined timing.

The quartz oscillator 22 for measurement provided in the film formation source unit 20 is placed at a position at which the quartz oscillator 22 for measurement may monitor the amount of the film forming material released from the film formation source 21. The deposition of the film forming material on the quartz oscillator 22 for measurement changes the resonance frequency of the quartz oscillator 22 for measurement. FIG. 2 is a circuit block diagram illustrating a control system of the film formation apparatus illustrated in FIGS. 1A to 1G. As illustrated in FIG. 2, the amount of change in resonance frequency of the quartz oscillator 22 for measurement is sensed by a film thickness measurement device 41. Then, an electrical signal which is output from the film thickness measurement device 41 (electrical signal concerning information of the amount of change in resonance frequency of the quartz oscillator 22 for measurement) is sent to a thermoregulator (not shown) provided in a control system 40 to control the heating part of the film formation source 21, for example, to adjust the heating temperature of the film forming material. In this way, the amount of the film forming material released from the film formation source 21 is controlled to be constant.

The quartz oscillator 23 for calibration provided in the film formation source unit 20 is placed at a position (vapors of) the film forming material released from the film formation source 21 may reach. As illustrated in FIG. 2, the amount of change in resonance frequency of the quartz oscillator 23 for calibration due to attachment thereto of the film forming material is sensed by a film thickness measurement device 42. Then, an electrical signal which is output from the film thickness measurement device 42 (electrical signal concerning information of the amount of change in resonance frequency of the quartz oscillator 23 for calibration) is sent to the control system 40 and then sent to the quartz oscillator 22 for measurement for appropriate calibration of the quartz oscillator 22 for measurement.

In the film formation apparatus 1 illustrated in FIGS. 1A to 1C, the film formation object 30 such as a substrate is brought into the film formation chamber 10 and is taken out of the film formation chamber 10 by a transport mechanism (not shown). When the film formation object 30 is brought into the film formation chamber 10, a support member (not shown) is used to support the film formation object 30 at a predetermined position.

Next, a film formation method using the film formation apparatus according to the present invention is described.

The film formation method according to the present invention has a particular feature in that a calibration step is performed in the middle of a film formation step for forming a film on the film formation object.

In the film formation method according to the present invention, the calibration step has the following steps (i) to (iii):

(i) a step of forming a film of the film forming material on each of the quartz oscillator for measurement and the quartz oscillator for calibration;

(ii) a step of determining a measured value A of the thickness of the film of the film forming material formed on the quartz oscillator for calibration and a measured value B of the thickness of the film of the film forming material formed on the quartz oscillator for measurement; and (iii) a step of calibrating the quartz oscillator for measurement using the ratio of A to B (A/B).

The film formation method according to the present invention is specifically described in the following.

First, as a preliminary stage of the film formation, a preliminary step of measuring the thickness of a film deposited on the quartz oscillator 22 for measurement per unit time, the thickness of a film deposited on the quartz oscillator 23 for calibration per unit time, and the thickness of a film deposited on the film formation object 30 and determining a film thickness ratio based on the measured values is performed.

In this preliminary step, first, the film formation object 30 is brought into the film formation chamber 10 by the transport mechanism (not shown). Then, at the time when the amount of the film forming material released from the film formation source 21 reaches a desired level, movement of the film formation source unit 20 is started and a thin film of the film forming material is formed on the film formation object 30. After reciprocating the film formation source unit 20 a predetermined number of times under predetermined movement conditions, the transport mechanism (not shown) is used to take the film formation object 30 out of the film formation chamber 10.

With regard to the thin film formed on the film formation object 30 which has been taken out here, the thickness of the thin film is measured using an optical film thickness measurement device or a contact film thickness measurement device. The measured value (film thickness value) is assumed to be t. On the other hand, the thickness of the thin film deposited on the quartz oscillator 22 for measurement per unit time when the film of the film forming material is formed on the film formation object 30 may be calculated from the amount of change in resonance frequency of the quartz oscillator 22 for measurement. Here, the thickness of the thin film deposited on the quartz oscillator 22 for measurement per unit time (film thickness value) is assumed to be M. Then, the ratio $\alpha$ of t to M (film thickness ratio) is expressed as $\alpha = t/M$.

Similarly to the case of the quartz oscillator 22 for measurement, the thickness of the thin film deposited on the quartz oscillator 23 for calibration per unit time calculated from the amount of change in resonance frequency of the quartz oscillator 23 for calibration (film thickness value) is assumed to be P. Then, the ratio $\beta$ of t to P (film thickness ratio) is determined by $\beta = t/P$. Note that, $\beta$ may be expressed as $\beta(=t/P) = \alpha \times M/P$.

Here, when the film thickness ratio $\beta$ is determined, it is preferred that excess deposition of the film forming material on the quartz oscillator 23 for calibration be prevented by, for example, using the sensor shutter 26. This may lengthen the time period during which the accuracy of measuring the film thickness provided by the quartz oscillator 23 for calibration remains high.

After the film thickness ratios $\alpha$ and $\beta$ are determined as described above, the film formation step of forming a film of the film forming material on the film formation object 30 is performed.

In the film formation step, first, a substrate which is the film formation object 30 is brought into the film formation chamber 10. Then, the film formation source unit 20 is caused to reciprocate under predetermined conditions between the film formation waiting position and the film forming position and the film of the film forming material is formed on the film formation object 30. After the film formation is completed, the film formation object is taken out of the film formation chamber 10. By repeating the film formation step, a film of the film forming material may be formed on multiple film formation objects 30.

Figure 3:
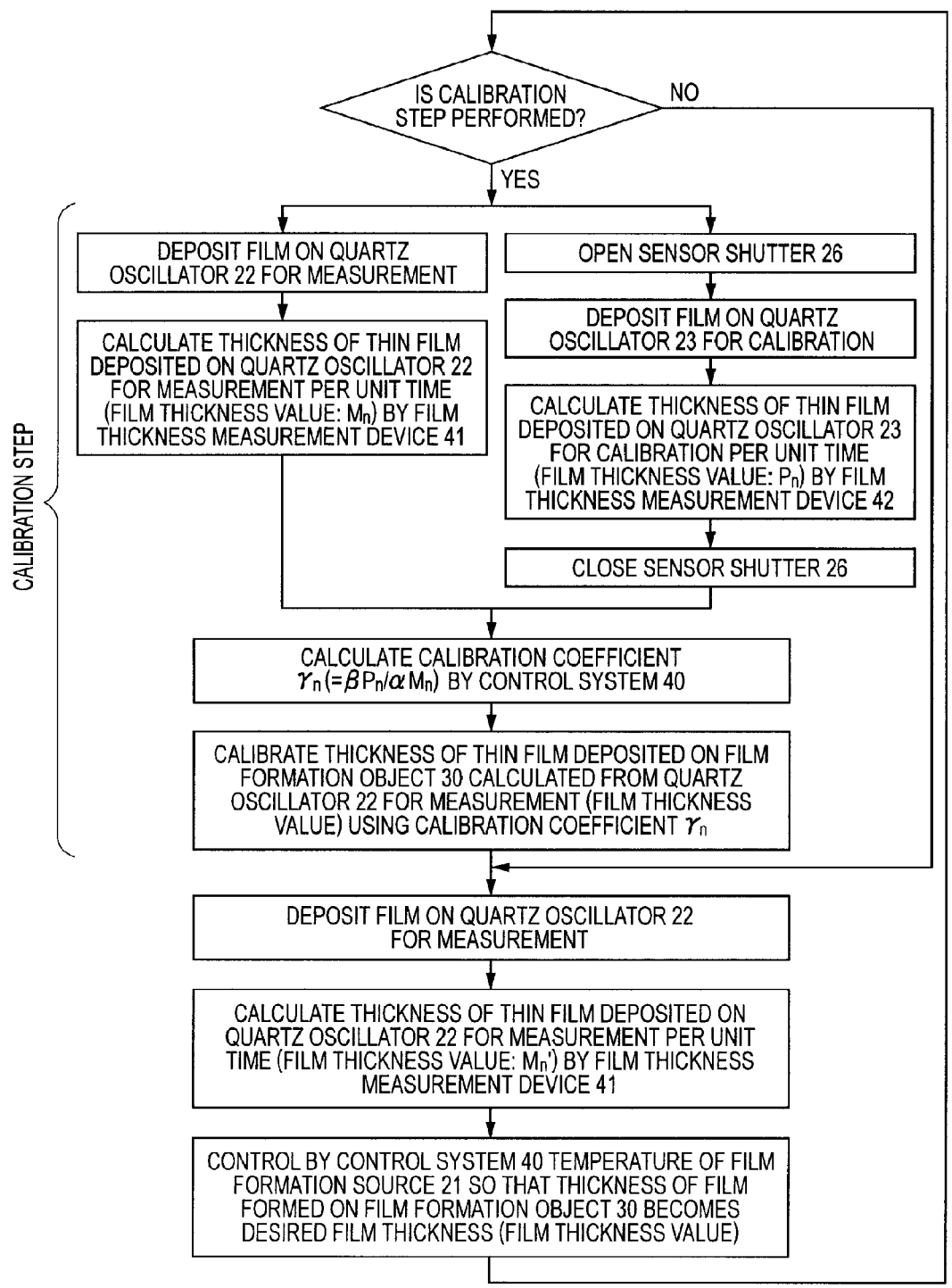
FIG. 3 is a flow chart illustrating a thickness control flow of a film of a film forming material formed on a film formation object.

FIG. 3 is a flow chart illustrating a thickness control flow of the film of the film forming material formed on the film formation object 30. Note that, in the flow chart illustrated in FIG. 3, a flow chart illustrating the calibration step is also included. In the following, description is made also with reference to the circuit block diagram of FIG. 2.

First, when the calibration step is not performed, while the sensor shutter 26 in proximity to the quartz oscillator 23 for calibration is closed, the film forming material is deposited on the quartz oscillator 22 for measurement. Here, the film thickness measurement device 41 electrically connected to the quartz oscillator 22 for measurement measures the amount of change in resonance frequency of the quartz oscillator 22 for measurement. From the amount of change in resonance frequency measured by the film thickness measurement device 41, a film thickness value $M_0'$ of the film deposited on the quartz oscillator 22 for measurement per unit time is calculated in the film thickness measurement device 41. Then, the film thickness measurement device 41 sends the film thickness value $M_0'$ to the thermoregulator (not shown) provided in the control system 40 which is electrically connected thereto, and determines the thickness of the thin film deposited on the film formation object 30, that is, a film thickness value $t_0$ $(=\alpha \times M_0')$. Here, if $t_0$ is larger than a desired film thickness, an electrical signal is sent from the film thickness measurement device 41 to the thermoregulator (not shown) provided in the control system so that the thermoregulator lowers the temperature of the film formation source 21. On the other hand, if $t_0$ is smaller than the desired film thickness, an electrical signal is sent from the film thickness measurement device to the thermoregulator so that the thermoregulator raises the temperature of the film formation source 21. When $t_0$ is equal to the desired film thickness, an electrical signal is sent from the film thickness measurement device 41 to the thermoregulator so that the thermoregulator maintains the temperature of the film formation source 21. Note that, as described above, the relative positional relationship between the quartz oscillator 22 for measurement and the film formation source does not change at any time, and thus, even when the film formation source unit 20 is moving, the film thickness value $M_0'$ may be always monitored and the temperature of the film formation source 21 may be always controlled. Therefore, the amount of the film forming material released from the film formation source 21 may be held constant.

However, during operation of the film formation source 21, the film forming material is deposited on the quartz oscillator 22 for measurement at all times, and thus, the accuracy of measuring the film thickness is gradually lowered. In such a case, the calibration step described below is performed.

In the calibration step, the sensor shutter 26 in proximity to the quartz oscillator 23 for calibration is opened at an arbitrary timing during the film formation step. Here, by causing the sensor shutter 26 to be open for a predetermined period of time or longer, a fixed amount of the film forming material is deposited on the quartz oscillator 23 for calibration, and thus, the thickness of the thin film formed on the quartz oscillator 23 for calibration per unit time (film thickness value $P_1$) may be determined. At the same time, the thickness of the thin film formed on the quartz oscillator 22 for measurement per unit time (film thickness value $M_1$) may be determined. After the film thickness values $P_1$ and $M_1$ are determined, the sensor shutter 26 is closed. Here, the thickness of the thin film formed on the film formation object 30 (film thickness value) may be determined as $\beta P_1$ using the film thickness value $P_1$, and also may be determined as $\mu M_1$ using the film thickness value $M_1$.

By the way, the amount of the film of the film forming material deposited on the quartz oscillator 23 for calibration is extremely small, and thus, the film thickness measurement error is small. On the other hand, a large amount of the film forming material is deposited on the quartz oscillator 22 for measurement, and thus, the film thickness measurement error is large. Therefore, it does not necessarily follow that $\beta P_1 = \alpha M_1$. Therefore, the film thickness value $M_1$ is multiplied by a correction factor $(\beta P_1 / \alpha M_1)$. Then, the film thickness value determined using the quartz oscillator 22 for measurement may be caused to be equal to a film thickness value $(\beta P_1)$ determined using the quartz oscillator 23 for calibration which has a smaller error, and thus, the film thickness value may be determined with only a small error.

After the calibration step, a film thickness value $M_1'$ of the film forming material deposited on the quartz oscillator 22 for measurement is determined. Then, the temperature of the film formation source 21 is controlled by the thermoregulator (not shown) provided in the control system 40 so that a value $\alpha\gamma_1 M_1'$ obtained by multiplying $M_1'$ by a calibration coefficient $\gamma_1(=(\beta P_1)/(\alpha M_1))$ and a is the desired film thickness value to be deposited on the film formation object 30.

The calibration step is appropriately performed as described above. In the film formation step which is performed after an n-th calibration step, the film forming material is deposited on the quartz oscillator 22 for measurement and a film thickness value $M_n'$ of the film forming material deposited per unit time is determined in the film thickness measurement device 41. Then, the temperature of the film formation source 21 is controlled by the thermoregulator (not shown) provided in the control system 40 so that a value $\alpha \times (\gamma_1 \times \gamma_2 \times \ldots \times \gamma_n) \times M_n'$ obtained by multiplying $M_n'$ by a calibration coefficient $(\gamma_1 \times \gamma_2 \times \ldots \times \gamma_n)$ and a is the desired film thickness value to be deposited on the film formation object 30.

The calibration step may be performed at an arbitrary timing based on the premise that the calibration step is performed in the middle of the film formation step, but may be performed every time a predetermined length of time passes, or may be performed every time the number of the film formation objects on which the film is formed reaches a predetermined number which is more than one. Further, the calibration step may be performed at the time when the amount of attenuation of the resonance frequency of the quartz oscillator 22 for measurement reaches a predetermined level, and may be performed at the time when the resonance frequency of the quartz oscillator 22 for measurement reaches a certain value.

Figure 4:
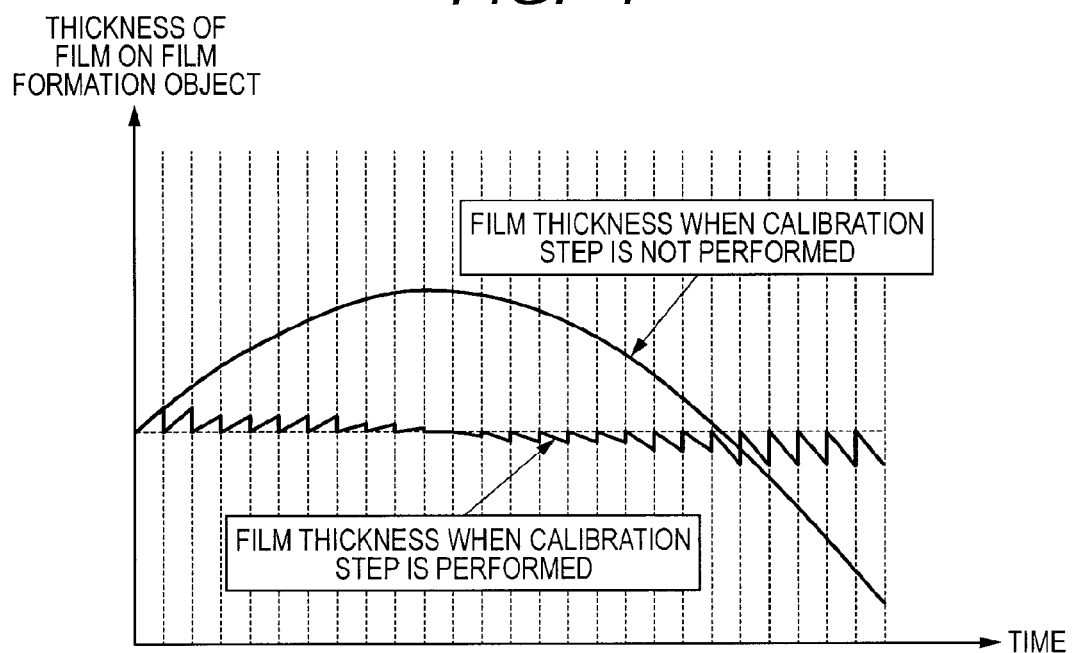
FIG. 4 is a graph which compares the thickness of a thin film formed on the film formation object when a calibration step is performed to that when the calibration step is not performed.

FIG. 4 is a graph which compares the thickness of the thin film formed on the film formation object 30 when the calibration step is performed to that when the calibration step is not performed. It is made clear that, as illustrated in FIG. 4, by appropriately carrying out the calibration step, the error in thickness of the film formed on the film formation object 30 may be reduced.

FIGS. 5A and 5B are diagrams which simulates the film formation steps and the calibration steps in predetermined cycles with the passage of time, and part FIG. 5A is a diagram illustrating the passage of time when a calibration step is performed in the middle of a film formation step, and FIG. 5B is a diagram illustrating the passage of time when a calibration step is performed between film formation steps. In other words, FIG. 5A is a diagram when the film formation method according to the present invention is adopted, while FIG. 5B is a diagram when a conventional film formation method is adopted. FIGS. 5A and 5B illustrate a case where the length of time of one film formation step is ten minutes and cycles each having five film formation steps and one calibration step having a length of time of five minutes are repeated for 24 hours. As illustrated in FIGS. 5A and 5B, by carrying out a calibration step in the middle of a film formation step, the number of the film formation steps may be caused to be larger than that when a calibration step is performed between film formation steps.

Here, as illustrated in FIGS. 1A to 1G, the film formation apparatus according to the present invention includes the film formation source unit 20 which has therein the film formation source 21, the quartz oscillator for measurement, and the quartz oscillator 23 for calibration. The film formation source 21 and the two quartz oscillators 22 and 23 always move together with the positional relationship therebetween being maintained. Therefore, the calibration step may be performed at any time. Further, by carrying out a calibration step in the middle of a film formation step, film formation may be performed without lowering the productivity with lowered film purity which is caused by a holdup of the film formation object being prevented and with the film thickness being accurate.

EXAMPLE

Example 1

The film formation apparatus illustrated in FIGS. 1A to 1C was used to form the film of the film forming material on the substrate.

In this example, the film was formed by reciprocating once the film formation source unit 20 with the transport distance being 1,000 mm and with the transport speed being 20 mm/s. The length in a longitudinal direction of the substrate (film formation object 30) was 500 mm.

Further, in this example, the heating temperature of the film formation source 21 was adjusted so that the thickness of the thin film of the film forming material formed on the substrate (film formation object 30) was 100 nm.

Further, in this example, as the quartz oscillator 22 for measurement and the quartz oscillator 23 for calibration, 6 MHz quartz oscillators having gold electrodes and manufactured by INFICON were used.

First, the preliminary step of the film formation was performed.

In this preliminary step, first, the substrate (film formation object 30) for measuring the film thickness was brought into the film formation chamber 10. After confirming that the amount of vapors of the film forming material released from the film formation source 21 had been stabilized at a desired value, movement of the film formation source unit 20 was started at a transport speed of 20 mm/s. At the time when ten seconds passed after the movement of the film formation source unit 20 was started, the sensor shutter 26 was opened, and the film forming material was deposited on the quartz oscillator 23 for calibration. Then, a thickness M (nm) of the film of the film forming material deposited on the quartz oscillator 22 for measurement and a thickness P (nm) of the film of the film forming material deposited on the quartz oscillator 23 for calibration from the time when 30 seconds passed to the time when 90 seconds passed after the sensor shutter 26 was opened were determined.

At the time when 91 seconds passed after the sensor shutter 26 was opened, the sensor shutter 26 was closed. Then, at the time when the film formation source unit 20 returned to the start position (film formation waiting position), the substrate (film formation object 30) for measuring the film thickness was taken out of the film formation chamber 10 using the transport mechanism (not shown), and then, the film thickness was measured using an optical film thickness measurement device or a contact film thickness measurement device. This determined the thickness of the thin film formed on the substrate for measuring the film thickness (film thickness value: t (nm)). Then, the ratio $\alpha$ of the thickness value of the film deposited on the substrate during 1 minute to the thickness value of the film deposited on the quartz oscillator 22 for measurement during 1 minute was expressed as $\alpha = t/M$, while the ratio $\beta$ of the thickness value of the film deposited on the substrate during 1 minute to the thickness value of the film deposited on the quartz oscillator 23 for calibration during 1 minute was expressed as $\beta = t/P$. Note that, in the preliminary step, the film thickness value t (nm) of the substrate satisfied a relational expression of $t = \alpha M = \beta P$.

Then, the step proceeded to the film formation step. In the film formation step, first, the substrate which was the film formation object 30 was brought into the film formation chamber 10. After the substrate was brought in, movement of the film formation source unit 20 was started. After the movement of the film formation source unit 20 was completed, the substrate was taken out of the film formation chamber 10 and the film formation step was completed.

As the film formation step was performed multiple times, films were deposited on the quartz oscillator 22 for measurement, and thus, the film thickness measurement error gradually became larger. Therefore, the calibration step described below was performed.

A first calibration step was performed in the middle of a tenth film formation step. More specifically, at the time when ten seconds passed after the movement of the film formation source unit 20 was started from the waiting position, the sensor shutter 26 was opened. Then, a thickness of the film of the film forming material deposited on the quartz oscillator 22 for measurement (film thickness value: $M_1$ (nm)) and a thickness of the film of the film forming material deposited on the quartz oscillator 23 for calibration (film thickness value: $P_1$ (nm)) from the time when 20 seconds passed to the time when seconds passed after the sensor shutter 26 was opened were determined. Here, from $M_1$ and $P_1$, the film thickness of the film forming material formed on the substrate (film thickness value) was determined to be $\alpha M_1$ (nm) or $\beta P_1$ (nm). However, the film thickness value $\alpha M_1$ (nm) had a large error while the film thickness value $\beta P_1$ (nm) had a small error. Therefore, it does not necessarily follow that $\alpha M_1 = \beta P_1$. Therefore, the calibration coefficient $\gamma_1 = (\beta P_1)/(\alpha M_1)$ was determined. In the film formation step after the calibration coefficient $\gamma_1$ was determined, the heating temperature of the film formation source 21 was adjusted so that the film thickness value $M_1'$ of the film deposited on the quartz oscillator 22 for measurement during 1 minute multiplied by the calibration coefficient $\gamma_1$ and the film thickness ratio $\alpha$ ($\alpha \times \gamma_1 \times M_1'$) was the desired film thickness of 100 nm to be deposited on the substrate.

However, if the heating temperature of the film formation source 21 is changed in the middle of the movement of the film formation source unit 20, the amount of the film forming material jetted from the film formation source 21 may hunt, or, the amount of the jetted film forming material may suddenly change to cause the film formed on the substrate to be nonuniform. Therefore, the heating temperature of the film formation source 21 was changed after the movement of the film formation source unit 20 was completed. In this way, hunting of the film forming material jetted from the film formation source 21 ended after the substrate was taken out and before the next substrate was brought in, and thus, the step was able to proceed to the next film formation smoothly.

As described above, the film formation step and the calibration step were performed. In the n-th calibration step which was performed in the middle of the 10n-th film formation step, the thicknesses of the thin films formed on the respective quartz oscillators were determined. More specifically, a thickness of the film of the film forming material formed on the quartz oscillator 23 for calibration during 1 minute (film thickness value: P, (nm)) and a thickness of the film of the film forming material formed on the quartz oscillator 22 for measurement during 1 minute (film thickness value: $M_n$ (nm)) were determined. Then, the calibration coefficient $\gamma_n$ was determined as $\gamma_n = (\beta P_n)/(\alpha M_n)$. In the film formation step after the calibration coefficient $\gamma_n$ was determined, the heating temperature of the film formation source 21 was adjusted so that the film thickness of the film of the film forming material formed on the quartz oscillator 22 for measurement during 1 minute (film thickness value $M_n'$) multiplied by the calibration coefficients determined in the first to the n-th calibration steps and the film thickness ratio $\alpha$, that is, $\alpha \times (\gamma_1 \times \gamma_2 \times \ldots \gamma_n) \times M_n'$ was 100 (nm). Note that, as described above, the heating temperature of the film formation source 21 was changed after the movement of the film formation source unit 20 was completed.

As a result of such film formation, it was made clear that film formation was able to be performed without lowering the productivity with lowered film purity, which was caused by a holdup of the substrate (film formation object 30) in the film formation chamber 10, being prevented and with the film thickness being accurate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2010-247816, filed Nov. 4, 2010, and 2011-211799 filed Sep. 28, 2011 which are hereby incorporated by reference herein in their entirety.

What is claimed is:

1. A film formation method comprising:
    a film formation step of moving, during deposition of a film, a film thickness sensor for monitoring and a film thickness sensor for calibration while maintaining a relative position of the film thickness sensor for monitoring and the film thickness sensor for calibration with respect to a position of an evaporation source to thereby form the film; and
    a calibration step of calibrating a thickness of the film obtained by use of the film thickness sensor for monitoring by using a calibration value calculated based on a thickness of the film obtained by use of the film thickness sensor for calibration,
    wherein the calibration step is performed concurrently with the film formation step after movement of the evaporation source is started from a waiting position.

2. The film formation method according to claim 1, wherein within a period of time in which the film formation step is performed a predetermined number of times, the calibration step is performed once.

3. The film formation method according to claim 1, wherein except a period of time in which the calibration step is performed, the film thickness sensor for calibration is blocked from vapor of a film forming material for constituting the film.

4. The film formation method according to claim 1, wherein within a period of time in which a film forming material is deposited to a film formation object in the film formation step, the calibration step is performed.

5. The film formation method according to claim 1, further comprising an adjusting step of adjusting an amount of vapor of the film forming material released from the evaporation source housing the film forming material for constituting the film, based on a thickness of the film obtained by use of the film thickness sensor for monitoring and calibrated in the calibration step.

6. The film formation method according to claim 5, wherein the adjusting step is a step for adjusting a temperature to which the film formation source is heated.

7. The film formation method of claim 1, wherein each of the film thickness sensor for monitoring and the film thickness sensor for calibration is a quartz oscillator.

* * * * *